United States Patent [19]

Krisch et al.

[11] 4,044,254
[45] Aug. 23, 1977

[54] SCANNING CORPUSCULAR-BEAM TRANSMISSION TYPE MICROSCOPE INCLUDING A BEAM ENERGY ANALYZER

[75] Inventors: Burkhard Krisch; Moriz V. Rauch, both of Berlin, Germany

[73] Assignee: Siemens Aktiengesellschaft, Munich, Germany

[21] Appl. No.: 715,847

[22] Filed: Aug. 19, 1976

[30] Foreign Application Priority Data

Aug. 28, 1975 Germany ............................ 2538523

[51] Int. Cl.² ............................................ G01M 23/00
[52] U.S. Cl. ...................................... 250/311; 250/306
[58] Field of Search .............................. 250/311, 306

[56] References Cited

U.S. PATENT DOCUMENTS

| | | | |
|---|---|---|---|
| 2,401,315 | 6/1946 | Ramberg | 250/311 |
| 2,547,994 | 4/1951 | Bertein | 250/311 |
| 2,580,675 | 1/1952 | Grivet et al. | 250/311 |
| 2,688,091 | 8/1954 | Tadana et al. | 250/311 |
| 3,504,176 | 3/1970 | Thon | 250/311 |

*Primary Examiner*—Harold A. Dixon
*Attorney, Agent, or Firm*—Kenyon & Kenyon, Reilly, Carr & Chapin

[57] ABSTRACT

A scanning corpuscular-beam transmission-type microscope including an energy analyzer below the specimen and a first deflection system disposed between the beam source and the specimen. A second deflection system is disposed between the specimen and the energy analyzer for redirecting the beam to the input aperture of the energy analyzer and is rotated with respect to the first deflection system to compensate for rotation of the specimen image by the objective lens of the microscope.

2 Claims, 3 Drawing Figures

SCANNING CORPUSCULAR-BEAM TRANSMISSION-TYPE MICROSCOPE INCLUDING A BEAM ENERGY ANALYZER

BACKGROUND OF THE INVENTION

1. Field of the Invention

This invention relates generally to scanning corpuscular-beam transmission-type microscopes, such as an electron microscope, and in particular to an improved microscope of the foregoing type which includes a first beam deflection means disposed between the source of the beam and the specimen and a second beam deflection means disposed between the specimen and a beam energy analyzing means.

2. Description of the Prior Art

Scanning corpuscular-beam transmission-type microscopes are known in the art. See, for example, German Pat. No. 1,439,828. Such microscopes include a magnetic objective lens for focusing the beam on a specimen, a deflection system disposed ahead of the specimen along the beam path for guiding and focusing the beam over the specimen in two orthogonal directions in raster-fashion, and a beam energy analyzer disposed behind the specimen along the beam path. Errors in known energy analyzers sharply increase with increasing distance of the corpuscular beam from the microscope axis. As a result, the resolution of the analyzer is reduced. Additional errors are caused in energy analyzers which depend upon the angle between the direction of the incident corpuscular beam and the microscope axis as the beam enters the energy analyzer. These additional errors also reduce the resolution of the analyzer.

SUMMARY OF THE INVENTION

It is therefore an object of the present invention to overcome the disadvantages of heretoforeknown microscopes and to provide an improved scanning corpuscular-beam transmission-type microscope which reduces resolution errors.

These and other objects are achieved in a scanning corpuscular-beam transmission-type microscope including a magnetic objective lens for focusing the beam on a specimen. The total field of the objective lens helically deflects parts of the beam not disposed in the microscope axis through an image rotation angle and rotates the image of the specimen in the microscope. First beam deflection means disposed between the source of the beam and the specimen guides the focused beam over the specimen in a first pair of orthogonal directions in raster-fashion and energy analyzing means disposed behind the specimen along the beam path analyzes the energy of the beam. The analyzing means includes an entrance aperture having a fixed input area disposed about the microscope axis.

The improvement of the invention comprises a second beam deflection means disposed between the specimen and the energy analyzing means for guiding the beam in a second pair of orthogonal directions disposed in a plane parallel to the first pair of orthogonal directions and rotated with respect to the first pair of orthogonal directions through an angle which coincides with the image rotation angle. The second beam deflection means redirects the beam, synchronously with the first beam deflection means, toward the input area of the entrance aperture of the energy analyzing means near the microscope axis.

Reduction of the errors caused by the angle between the direction of the corpuscular beam and the microscope axis as the beam enters the energy analyzer is achieved by the scanning corpuscular-beam transmission-type microscope construction described above.

The second deflection means may comprise two beam deflection stages disposed along the microscope axis. The first of these stages is disposed after the specimen along the beam path and redirects the beam at an angle with respect to the microscope axis toward the axis. The second of the stages is disposed after the first stage along the beam path and deflects the beam so that it enters the fixed input area of the entrance aperture of the energy analyzing means in a direction parallel to the microscope axis. This arrangement eliminates the additional errors in the energy analyzer which depend upon the direction of the incident beam and the microscope axis.

These and other features of the invention will be described in greater detail in the following detailed description.

DETAILED DESCRIPTION

Figure 1:
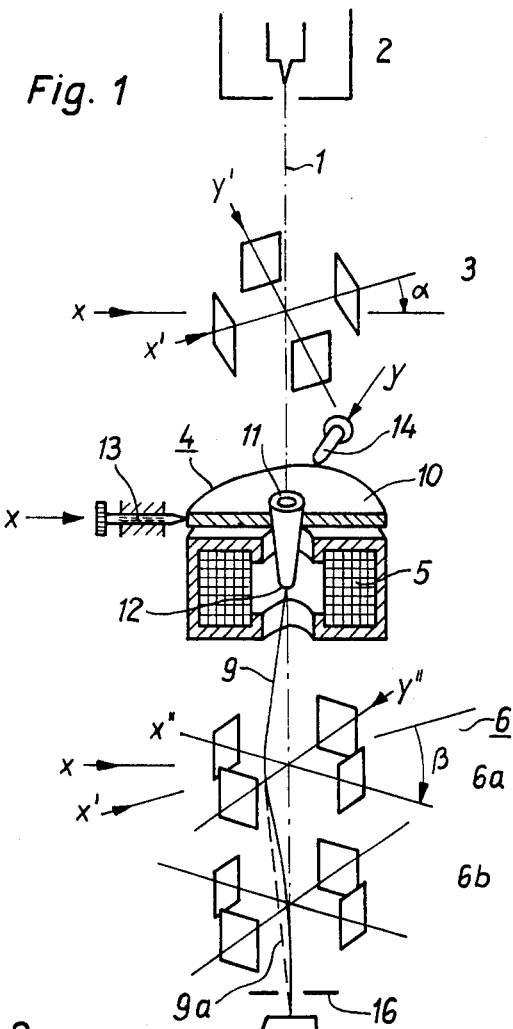
FIG. 1 is a schematic illustration of an improved scanning transmission-type corpuscular beam microscope constructed in accordance with the present invention.

Referring now to the drawings, and in particular to FIG. 1, there is shown, in schematic form, a scanning transmission-type electron microscope including an electron beam source 2, a first beam deflection means 3, a specimen stage 4, a magnetic objective lens 5, a second beam deflection means 6, an energy analyzing means 7 and a picture tube monitor 8. The axis of the microscope is identified by the reference numeral 1. The electron beam source 2 may comprise, for example, a field emission cathode.

The second beam deflection means comprises two beam deflection stages 6a and 6b, the second stage 6b being disposed after first stage 6a along the beam path. The first beam deflection means 3 and the two beam deflection stages 6a and 6b comprise, in the illustrated embodiment of the invention, electrostatic deflection systems which include two pairs of plates each. Magnetic deflection systems with two pairs of coils each can, however, be used instead. The deflection system 8a of the picture tube monitor 8, which may comprise a cathode ray tube, is controlled synchronously with beam deflection means 3 and 6.

Specimen stage 4 consists of a table 10 which holds a specimen cartridge 11. The specimen is disposed at the lower end 12 of cartridge 11 in the field of magnetic objective lens 5. Table 10 is adjustable transversely with respect to axis 1 in two orthogonal directions, namely, in the x-direction by a plunger 13 and in the y-direction by a plunger 14.

In the illustrated embodiment of the invention, energy analyzing means 7 comprises a magnetic sector field spectrometer. The beam radiation passing through the specimen enters energy analyzing means 7 by means of an input aperture 16 which has a fixed input area disposed about microscope axis 1. The output radiation of the analyzing means is registered by a detector 17 disposed subsequent to analyzing means 7 along the beam path. The output of the detector is coupled to the brightness control of monitor 8.

Figure 1A:
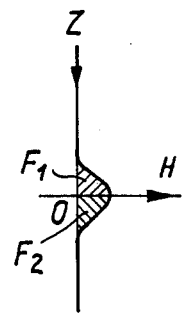
FIG. 1a is a graphical illustration of the magnetic field of a magnetic objective lens used in a microscope constructed in accordance with the present invention.

FIG. 1a graphically illustrates the shape of the field strength H of objective lens 5 in the z-direction, i.e., along microscope axis 1. The specimen is located at $z = 0$, in the center of the field. The field of objective lens 5 has the effect that the charged particles of the beam which are not in axis 1 are deflected helically. This results in a so-called "rotation" of the image through an image rotation angle which is characteristic of magnetic lenses. The image rotation is proportional to the integral of the field intensity of the field through which the beam travels. In the microscope shown in the drawings, this integral, taken up to the specimen disposed at the point 12, is equal to the area $F_1$ in FIG. 1a. This image rotation angle is identified by the reference angle $\alpha$ in the drawings.

First beam deflection means 3 is oriented so that the image rotation occurring up to specimen 12 is compensated for. To accomplish this, the one deflection direction $x'$ of first beam deflection means 3, which may coincide with the direction of the lines of monitor 8, is rotated relative to adjustment direction $x$ of specimen stage 4 in a plane perpendicular to microscope axis 1 so that direction $x'$ forms the angle $\alpha$ with direction $x$. Deflection direction $y'$ is also rotated in the same manner with respect to adjustment direction $y$. Thus, an electron ray disposed in the beam deflected by the first beam deflection means in the plane which contains microscope axis 1 and deflection direction $x'$ is, at the height of specimen 12, deflected in the plane of the drawing in the adjustment direction $x$. As a result, a mechanical movement of specimen stage 4 in the $x$ direction causes movement of the picture on monitor 8 in the direction of the monitor lines, while movement of the specimen in the $y$ direction causes the monitor picture to travel perpendicular to the direction of the monitor lines. This greatly facilitates orientation on the specimen and the location of details by the observer.

Stage 6a of second beam deflection means 6 redirects the beam passing through the specimen at large or small angles with respect to axis 1 toward the microscope axis.

The deflection directions of second beam deflection means 6 are designated $x''$ and $y''$. Deflection direction $x''$ is rotated through an angle $\beta$ with respect to deflection direction $x'$ of beam deflection means 3. The angle $\beta$ corresponds to the angular rotation of the image caused by the entire field of objective lens 5 and is proportional to the sum of the areas $F_1$ and $F_2$ illustrated in FIG. 1a. A beam which is deflected by first beam deflection means 3 in the plane $1/x'$, travels after passing through objective lens 5, in a plane rotated by the angle $\beta$, i.e., in the plane $1/x''$. The beam, thus, can be redirected exactly into microscope axis 1 by the pair of plates of first beam deflection stage 6a which cause deflection in direction $x''$. A redirected beam is identified by reference numeral 9 in FIG. 1, and is deflected by deflection stage 6a so that it would meet microscope axis 1 at approximately the center of deflection stage 6b if it continued in a straight line.

The purpose of second beam deflection stage 6b is to deflect beam 9 in such a manner that it passes through the fixed input area of energy analyzing means 7 defined by an entrance aperture 16 in the direction of microscope axis 1, and more specifically, due to the effect of deflection stage 6a, at a smaller distance from the microscope axis beam, as can be seen in FIG. 1.

If requirements for the resolution of energy analyzing means 7 are less stringent, second beam deflection stage 6b may be dispensed with and deflection stage 6a may be excited so that beam 9 is directed along the path 9a, shown in the drawings by the dashed line, directly toward the center of aperture 16. This arrangement eliminates at least the distance errors of energy analyzing means 7, but not the directional errors thereof.

Scanning electron microscopes of the type described herein are usually operated with constant excitation of the objective lens. In this situation, beam deflection means 3 and 6 can be built in the microscope with fixed angular deviations relative to adjustment directions $x$ and $y$. If large variations of the excitation of the objective lens are intended, beam deflection means 3 and 6 can be designed so that they are rotatable about microscope axis 1 mechanically and drive mechanisms can be provided, operable from outside the microscope housing, for rotating the deflection means.

Figure 2:
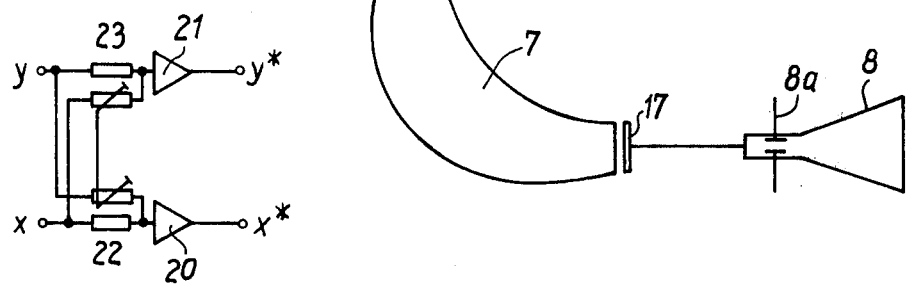
FIG. 2 is a schematic electrical diagram of a circuit for matching the beam deflection directions of the second beam deflection means to the excitation of the objective lens of a microscope constructed according to the present invention.

Angular adjustment of beam deflection means 3 and 6 relative to the adjustment devices of the specimen stage by smaller angles is, however, also possible by electronic means. A circuit for achieving this is shown in FIG. 2. The usual sawtooth voltages are supplied by a raster generator to input terminals $x$ and $y$, i.e., the line voltage at $x$ and the frame voltage at $y$. These voltages are fed by means of amplifiers 20 and 21 to the input terminals $x*$ and $y*$ of either of the deflection means 3 or 6. The input terminals of amplifiers 20 and 21 are coupled to each other by means of potentiometers 22 and 23, respectively. Depending on the setting of the potentiometers, the voltages generated at output terminals $x*$ and $y*$ have a defined phase shift, i.e., an angular rotation relative to the voltage signals applied to output terminals $x$ and $y$. For smaller adjustment angles (up to about 5°) linear potentiometers are sufficient; for larger angles, sine and cosine potentiometers are necessary.

It is also possible to couple the adjusting terminals of potentiometers 22 and 23 to the current supply of the objective lens in such a manner that the angle $\alpha$ is automatically matched to the image rotation caused by the field integral $F_1 + F_2$ when the excitation or polarity of objective lens 5 changes.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a scanning corpuscular-beam transmission-type microscope including a magnetic objective lens for focusing the beam on a specimen, the total field of the objective lens helically deflecting parts of the beam not disposed in the microscope axis through an image rotation angle and rotating the image of the specimen in the microscope; first beam deflection means disposed between the source of the beam and the specimen for guiding the focused beam over the specimen in a first pair of orthogonal directions in raster-fashion; and energy analyzing means disposed behind the specimen along the beam path for analyzing the energy of the beam including an entrance aperture with a fixed input area disposed about the microscope axis; the improvement comprising:

second beam deflection means disposed between said specimen and said energy analyzing means, for guiding said beam in a second pair of orthogonal directions disposed in a plane parallel to said first pair of orthogonal directions and rotated with respect to said first pair of orthogonal directions through an angle which coincides with said image rotation angle, said second beam deflection means redirecting said beam, synchronously with said first beam deflection means, toward said fixed input area of said entrance aperture of said energy analyzing means near the microscope axis.

2. The microscope recited in claim 1, wherein said second deflection means comprises two beam deflection stages disposed along the microscope axis, the first of said stages being disposed after the specimen along the beam path for redirecting said beam at an angle with respect to the microscope axis toward said axis, and the second of said stages being disposed after said first stage along the beam path and deflecting said beam so that said beam enters said fixed input area of said entrance aperture of said energy analyzing means in a direction parallel to said microscope axis.

* * * * *